(12) United States Patent
Hegde

(10) Patent No.: US 8,313,947 B2
(45) Date of Patent: Nov. 20, 2012

(54) METHOD FOR TESTING A CONTACT STRUCTURE

(75) Inventor: Rama I. Hegde, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 56 days.

(21) Appl. No.: 12/818,536

(22) Filed: Jun. 18, 2010

(65) Prior Publication Data

US 2011/0308080 A1    Dec. 22, 2011

(51) Int. Cl.
*G01N 31/20* (2006.01)
*G01N 33/20* (2006.01)
*B44C 1/22* (2006.01)
*C23F 1/30* (2006.01)

(52) U.S. Cl. .......... 436/5; 216/38; 216/83; 216/84; 216/85

(58) Field of Classification Search .......... 216/38, 216/83–85; 436/5
See application file for complete search history.

(56) References Cited

U.S. PATENT DOCUMENTS

| | | | | |
|---|---|---|---|---|
| 3,680,206 A * | 8/1972 | Roberts | ............ | 29/840 |
| 4,005,523 A * | 2/1977 | Milshtein | ............ | 438/106 |
| 5,076,906 A * | 12/1991 | DerMarderosian, Jr. | ............ | 205/791 |
| 5,476,688 A * | 12/1995 | Ostolski | ............ | 427/437 |
| 6,391,662 B1 * | 5/2002 | Mule'Stagno et al. | ............ | 438/8 |
| 6,413,788 B1 * | 7/2002 | Tuttle | ............ | 438/3 |
| 6,448,084 B1 * | 9/2002 | Batteate et al. | ............ | 436/5 |
| 6,453,263 B1 * | 9/2002 | Sirtori et al. | ............ | 702/170 |
| 2001/0053521 A1 * | 12/2001 | Kreimer et al. | ............ | 435/6 |
| 2002/0132371 A1 * | 9/2002 | Kreimer et al. | ............ | 436/525 |
| 2004/0023293 A1 * | 2/2004 | Kreimer et al. | ............ | 435/7.1 |
| 2009/0184382 A1 * | 7/2009 | Hartman et al. | ............ | 257/431 |
| 2010/0140685 A1 * | 6/2010 | Kang et al. | ............ | 257/324 |
| 2011/0260585 A1 * | 10/2011 | Ichikawa et al. | ............ | 310/344 |

OTHER PUBLICATIONS

Ohring, Milton, "Reliability and Failure of Electronic Materials and Devices", 1998, Chapter 11—Characterization and Failure Analysis of Materials and Devices, pp. 587-640.*
Standard Test Method for Porosity in Gold Coating on Metal Substrates by Paper Electrography ASTM B741-95 (2000); 2 Pages; ASTM International, West Conshohocken, PA (www.astm.org).
Standard Test Method for Porosity in Gold and Palladium Coatings by Sulfurous Acid/Sulfur-Dioxide Vapor—ASTM B799-95(2009); 4 Pages; ASTM International, West Conshohocken, PA (www.astm.org).
Standard Test Method for Porosity in Gold Coatings on Metal Substrates by Nitric Acid Vapor—Designation B735-06; 4 Pages; ASTM International, West Conshohocken, PA (www.astm.org).
Meng et al.; "Discoloration related failure mechanism and its root cause in Electroless Nickel Immersion Gold (ENIG) Pad metallurgical surface finish"; Proceedings of 11th IPFA 2004, Taiwan; 2004; pp. 229-233; IEEE.

* cited by examiner

*Primary Examiner* — Arlen Soderquist
(74) *Attorney, Agent, or Firm* — Joanna G. Chiu; David G. Dolezal

(57) ABSTRACT

A method of testing a contact structure including exposing a gold layer of at least one contact structure of a support structure to a solution including glacial acetic acid and nitric acid; and determining a porosity of the gold layer of at least one contact structure after the exposing.

22 Claims, 3 Drawing Sheets

METHOD FOR TESTING A CONTACT STRUCTURE

BACKGROUND

1. Field

This disclosure relates generally to testing, and more specifically, to testing porosity of a gold layer of a contact structure.

2. Related Art

In many semiconductor applications today, contact pads commonly use a gold layer to which connections are made during subsequent assembly. Therefore, the porosity, contamination, and associated defects of the gold contact layer affect the quality and reliability of the resulting assembly. Testing the gold contact layer is therefore needed to reduce assembly failures and thus improve yield.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Contact structures commonly use a gold layer to which connections are made during subsequent assembly. For example, a batch of support structures, each having at least one contact structure which has a gold layer, may be received for assembling into electronic assemblies. In one embodiment, one or more of the support structures may be selected in order to test the porosity of the gold layer of the at least one contact structure. In this manner, it may be determined whether or not the batch of support structures is suitable for use in subsequent assembly. In one embodiment, the testing of the porosity of the gold layer is performed by exposing the gold layer to a solution containing glacial acetic acid and nitric acid, rinsing the gold layer with deionized (DI) water, rinsing the gold layer with a cleaning agent, and drying the gold layer with an inert gas. This method enhances the visibility of the pores or holes present in the gold layer, and the gold layer may then be optically inspected to determine its porosity.

Figure 1:
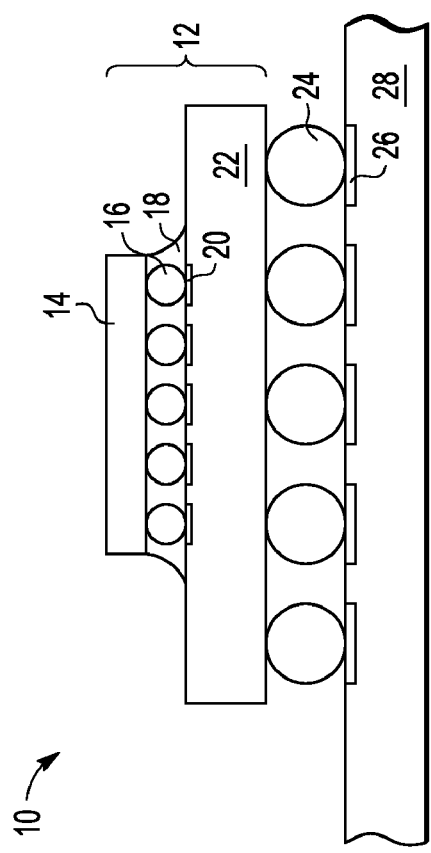
FIG. 1 illustrates a cross-sectional view of an exemplary flip-chip electronic assembly.

FIG. 1 illustrates a cross-sectional view of an exemplary flip-chip electronic assembly having a flip-chip package 12 attached to a printed circuit board (PCB) 28 by way of solder balls, such as solder ball 24. Flip-chip package 12 includes an integrated circuit die 14 attached to a package substrate 22 by way of solder balls, such as solder ball 16. Flip-chip package 12 also includes an underfill material 18 between die 14 and package substrate 22 and surrounding the solder balls between die 14 and package substrate 22. Package substrate 22 includes a plurality of contact structures, such as contact structure 20. Each contact structure has a corresponding solder ball, such as solder ball 16, connected to it, in which the solder balls provide electrical connections between die 14 and package substrate 22. Similarly, PCB 28 includes a plurality of contact structures, such as contact structure 26, in which each contact structure has a corresponding solder ball, such as solder ball 24, connected to it. The solder balls between package substrate 22 and PCB 28 provides electrical connections between package substrate 22 and PCB 28 (and thus between flip-chip package 12 and PCB 28.)

Note that either the contact structures of package substrate 22 or of PCB 28 (such as contact structure 20 and 26, respectively) may include an exposed gold layer which, due to its method of manufacture, may be porous or too porous for subsequent reliable assembly. For example, if the gold layer of contact structure 20 (which is in contact with solder ball 16) is more porous than a particular porosity threshold, an unreliable electrical contact may exist between die 14 and package substrate 22. Similarly, if contact structure 26 (which is in contact with solder ball 24) is more porous than a particular porosity threshold, an unreliable electric contact may exist between package substrate 22 and PCB 28.

Figure 2:
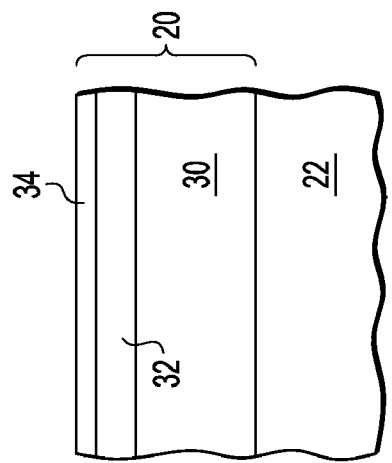
FIG. 2 illustrates a cross-sectional view of an exemplary contact structure of the flip-chip electronic assembly of FIG. 1.

For example, FIG. 2 illustrates a cross-sectional view of a portion of contact structure 20 and package substrate 22 (prior to attachment of die 14). In the illustrated example, contact structure 20, which is formed over package substrate 22, may include a first layer 30 over package substrate 22, a second layer 32 over first layer 30, and a gold layer 34 over second layer 32. In one embodiment, first layer 30 is a copper layer and second layer 32 is a nickel layer. In one embodiment, the copper layer has a thickness of greater than 10 micrometers, the nickel layer has a thickness in a range of 1 to 10 micrometers, and the gold has a thickness in a range of 0.005 to 0.15 micrometers. In one embodiment, an electroless nickel immersion gold (ENIG) deposition method is used to form contact structure 20. Alternatively, other deposition methods may be used, additional or few layers may be present under gold layer 34, or different materials may be used for the layers. For example, second layer 32 may be gold-palladium rather than nickel. In one embodiment, if gold layer 34 is too porous, then the material from second layer 32 (such as, for example, nickel) may diffuse up through the gold during subsequent processing. Therefore, prior to using contact structure 20 for subsequent assembly (such as prior to using semiconductor package 22 for forming a flip-chip assembly), the batch containing package substrate 22 can be tested to determine whether the gold layer of the contact structure is too porous for reliable use.

Figure 4:
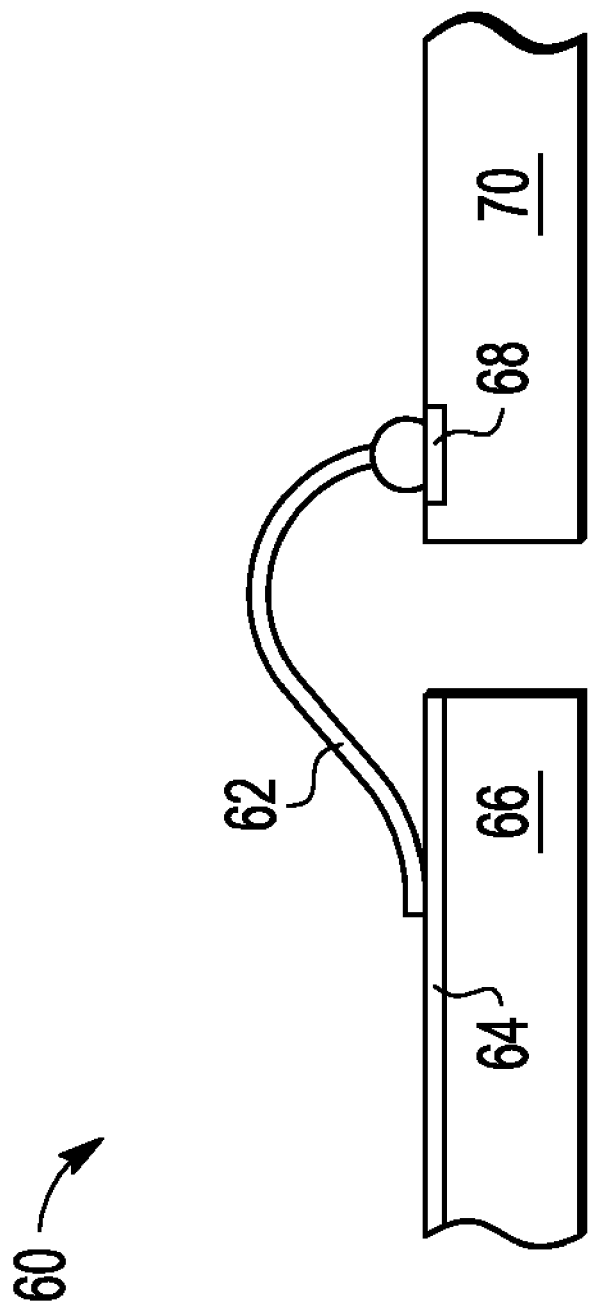
FIG. 4 illustrates a cross-sectional view of a portion of an exemplary wire bond electronic assembly.

Note that the same descriptions here in FIG. 2 for contact structure 20 could also apply to contact structure 26, or any other contact structure which has a gold layer. For example, FIG. 4 illustrates a wire bond assembly 60 which includes a bond post 66 of a lead frame having a contact structure 64 and an integrated circuit die 70 having a contact structure 68. A wire bond 62 electrically connects contact structure 68 to contact structure 64, where, for example, a ball bond portion of wire bond 62 is connected to contact structure 68 and a wedge bond portion of wire bond 62 is connected to contact structure 64. Contact structures 64 and 68 may each have any number of layers, but either one may include an exposed gold layer to which wire bond 62 connects. Therefore, if the contact structure includes an exposed gold layer, it is also susceptible to the porosity problems similar to the problems described for contact structure 20.

Figure 3:
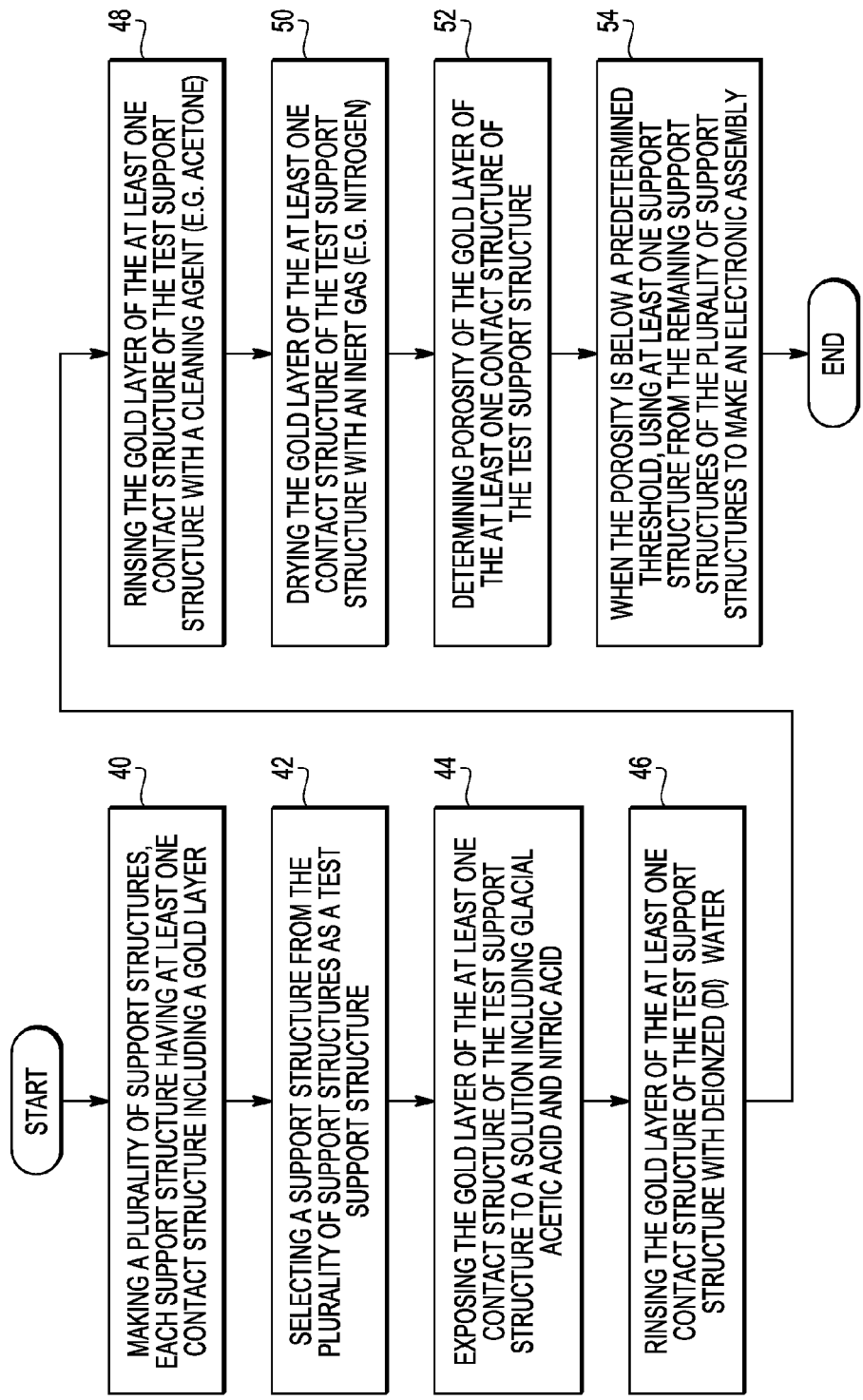
FIG. 3 illustrates, in flow diagram form, a method of testing a contact structure, in accordance with one embodiment.

FIG. 3 illustrates a method for testing the porosity of the gold layer of a contact structure in accordance with one embodiment. The method begins with block 40 in which a plurality of support structures are made, in which each support structure has at least one contact structure including a gold layer. For example, the plurality of support structures can be all or a portion of a particular batch of support structures that were manufactured under the same processes, wherein one or more support structures of that batch may be tested for gold porosity to determine whether the remaining support structures of the batch can be used for subsequent assembly. In one embodiment, the support structure can be any structure which supports the contact structure having the gold layer. For example, it can be a package substrate in any type of semiconductor package technology (such as a package substrate in a flip-chip assembly), a device substrate (such as integrated circuit die 14 or 70), a lead frame, etc. In one embodiment, the contact structure can be any type of contact structure which includes a gold layer, such as, for example, a contact pad of a support structure which can receive, for example, a solder ball, a ball bond of a wire bond, a wedge bond of a wire bond, a gold post, etc.

Referring back to FIG. 3, the method continues with block 42 in which a support structure of the plurality of support structures is selected as a test support structure. The test support structure therefore includes at least one contact structure which includes a gold layer that can be susceptible to porosity issues. The method continues with block 44 in which the gold layer of the at least one contact structure of the test support structure is exposed to an acidic solution including glacial acetic acid and nitric acid. As used herein, glacial acetic acid is an acetic acid solution which includes at most one percent water. In one embodiment, the solution includes glacial acetic acid and nitric acid in a 1:1 ratio. Alternatively, other ratios for glacial acetic acid to nitric acid may be used, such as 2:1, 3:1 and 4:1. In one embodiment, the test support structure is dipped into the acidic solution. In one embodiment, an ultrasonic bath is used for dipping the test support structure into the acidic solution. In one embodiment, the exposure to the acidic solution is performed at room temperature, such as at a temperature in a range of 20 degrees Celsius to 28 degrees Celsius. In one embodiment, the exposure to the acidic solution is performed at any temperature less than 65 degrees Celsius, or alternatively, any temperature less than 60 degrees Celsius. Also, in one embodiment, the exposure to the acidic solution is performed for 30 minutes or less. For example, in one embodiment, the exposure to the acidic solution is performed at room temperature for 30 minutes or less.

Still referring to FIG. 3, the method continues to block 46 in which the gold layer of the at least one contact structure of the test support structure is rinsed with deionized (DI) water. In one embodiment, the DI water helps remove the acidic solution and any contaminants which remain on the surface of the gold layer. The method continues with block 48 in which the gold layer of the at least one contact structure of the test support structure is rinsed with a cleaning agent, such as, for example, acetone or isopropyl alcohol. In one embodiment, the cleaning agent is a solvent which aids in cleaning and drying the surface of the gold layer. The method continues with block 50 in which the gold layer of the at least one contact structure of the test support structure is dried with an inert gas, such as, for example, nitrogen, argon, or helium. In one embodiment, the inert gas aids in cleaning off any remaining residue or particles and remove any remaining liquid.

Still referring to FIG. 3, the method continues to block 52 in which the porosity of the gold layer of the at least one contact structure of the test support structure is determined. In one embodiment, the exposure of the gold layer to the acidic solution results in making the pores of the gold layer more visible. (Furthermore, the subsequent rinsing and drying may further enhance visibility of the pores) In this manner, as a result of exposing the gold layer to the acidic solution, an optical inspection may be performed to determine the porosity of the gold layer. The optical inspection may be performed by machine or human. This porosity determination may then be used to determine whether the plurality of support structures from which the test support structure was selected is sufficiently non-porous for use in subsequent assembly. For example, the porosity of the gold layer may be compared with a predetermined porosity threshold to determine whether processing should continue.

Still referring to FIG. 3, the method continues to block 54 in which, when the porosity of the gold layer of the test support structure is below a predetermined threshold, at least one support structure from the remaining support structures of the plurality of support structures is used to make an electronic assembly (such as, for example, a flip-chip assembly, wire-bond assembly, etc.). That is, an unselected support structure (which was not selected at block 42 of the method of FIG. 3) can be determined as sufficiently non-porous for use in making an electronic assembly based at least in part on the porosity determination of the selected support structure. For example, if the support structure selected as the test support structure is too porous (more porous than the predetermined threshold), then it may be assumed that the remaining unselected support structures of the plurality of support structures may also be too porous and thus may not be used in subsequent processing to make electronic assemblies. In one embodiment, more than one support structures of the plurality of support structures can be selected and tested, in which a determination of whether the remaining, unselected support structures can be used to make electronic assemblies is based on the porosity results of the one ore more support structures. That is, the determination of whether a plurality of support structures is to be used in making electronic assemblies may be made based on the gold layer porosity of one or more support structures of the plurality of support structures. (Note that, in one embodiment, those support structures which are used for testing the gold layer porosity are not subsequently used to form electronic assemblies.)

By now it should be appreciated that there has been provided a method for testing the porosity of a contact structure which includes an exposed gold layer. For example, by dipping or exposing the exposed gold layer to an acidic solution including glacial acetic acid and nitric acid, the pores of the gold layer may be visibly enhanced for easier detection. Therefore, batches of support structures which are manufactured or received can be tested to determine whether they should be used to form electronic assemblies. One or more support structures from each batch can be selected as a test structure to determine whether the remaining support structures will be used in electronic assemblies. In this manner, yield and reliability may be improved.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the contact structure having a gold layer can a contact structure in any type of electronic assembly, and is not limited to flip-chip or wire bond assemblies. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of testing a contact structure, where the method includes exposing a gold layer of at least one contact structure of a support structure to a solution including glacial acetic acid and nitric acid; and determining a porosity of the gold layer of at least one contact structure after the exposing. Item 2 includes the method of item 1 and further includes rinsing the gold layer of the at least one contact structure after the exposing; wherein the determining a porosity is performed after the rinsing. Item 3 includes the method of item 2 wherein the rinsing includes rinsing with deionized water. Item 4 includes the method of item 2 wherein the rinsing includes rinsing with a cleaning agent. Item 5 includes the method of item 4 wherein the cleaning agent includes acetone. Item 6 includes the method of item 1 and further includes after the exposing, drying the gold layer of the at least one contact structure with an inert gas, wherein the determining occurs after the drying. Item 7 includes the method of item 1 wherein the exposing is performed for less than 30 minutes. Item 8 includes the method of item 1 wherein each of the at least one contact structure includes a layer including nickel underneath the gold layer of the contact structure.

Item 9 includes a method of making an electronic assembly, the method including selecting a support structure from a plurality of support structures for testing; exposing a gold layer of at least one contact structure of the support structure to a solution including glacial acetic acid and nitric acid; determining a porosity of the gold layer of at least one contact structure after the exposing; determining to use a second support structure of the plurality of support structures to make an electronic assembly, wherein the determining to use is based at least on the determined porosity of the gold layer of the at least one contact structure; and making an electronic assembly with the second support structure. Item 10 includes the method of item 9 wherein the making the electronic assembly includes attaching a semiconductor die to the second support structure, wherein the attaching includes electrically coupling a conductive structure of the semiconductor die to a contact structure of the second support structure. Item 11 includes the method of item 9 wherein each of the at least one contact structure includes a layer including nickel underneath the gold layer of the contact structure. Item 12 includes the method of item 9 and further includes rinsing the gold layer of the at least one contact structure after the exposing; wherein the determining a porosity is performed after the rinsing. Item 13 includes the method of item 12 wherein the rinsing includes rinsing with deionized water. Item 14 includes the method of item 12 wherein the rinsing includes rinsing with a cleaning agent. Item 15 includes the method of item 14 wherein the cleaning agent includes acetone. Item 16 includes the method of item 9 and further includes after the exposing, drying the gold layer of the at least one contact structure with an inert gas, wherein the determining a porosity occurs after the drying. Item 17 includes the method of item 9 wherein the exposing is performed for less than 30 minutes. Item 18 includes the method of item 9 wherein the plurality of support structures are manufactured using the same processes.

Item 19 includes a method of testing a contact structure, where the method includes exposing a gold layer of at least one contact structure of a support structure to a solution including glacial acetic acid and nitric acid; rinsing the gold layer of the at least one contact structure with a cleaning agent after the exposing; drying the gold layer of the at least one contact structure with an inert gas after the rinsing; and determining a porosity of the gold layer of at least one contact structure after the drying. Item 20 includes the method of item 19 wherein each of the at least one contact structure includes a layer including nickel underneath the gold layer of the contact structure.

What is claimed is:

1. A method of testing a contact structure, the method comprising:
    exposing a gold layer of at least one contact structure of a package substrate to a solution including glacial acetic acid and nitric acid; and
    determining a porosity of the gold layer of at least one contact structure after the exposing.

2. The method of claim 1 further comprising:
    rinsing the gold layer of the at least one contact structure after the exposing;
    wherein the determining a porosity is performed after the rinsing.

3. The method of claim 2 wherein the rinsing includes rinsing with deionized water.

4. The method of claim 2 wherein the rinsing includes rinsing with a cleaning agent.

5. The method of claim 4 wherein the cleaning agent includes acetone.

6. The method of claim 1 further comprising:
    after the exposing, drying the gold layer of the at least one contact structure with an inert gas, wherein the determining occurs after the drying.

7. The method of claim 1 wherein the exposing is performed for less than 30 minutes.

8. The method of claim 1 wherein each of the at least one contact structure includes a layer including nickel underneath the gold layer of the contact structure.

9. The method of claim 1, wherein the solution includes glacial acetic acid and nitric acid in a 1:1 ratio.

10. A method of making an electronic assembly comprising:
    selecting a package substrate from a plurality of package substrates for testing;
    exposing a gold layer of at least one contact structure of the package substrate to a solution including glacial acetic acid and nitric acid, wherein the solution;
    determining a porosity of the gold layer of at least one contact structure after the exposing;
    determining to use a second support substrate of the plurality of package substrates to make an electronic assembly, wherein the determining to use is based at least on the determined porosity of the gold layer of the at least one contact structure; and making an electronic assembly with the second package substrate.

11. The method of claim 10 wherein the making the electronic assembly includes attaching a semiconductor die to the second package substrate, wherein the attaching includes electrically coupling a conductive structure of the semiconductor die to a contact structure of the second package substrate.

12. The method of claim 10 wherein each of the at least one contact structure includes a layer including nickel underneath the gold layer of the contact structure.

13. The method of claim 10 further comprising:
rinsing the gold layer of the at least one contact structure after the exposing;
wherein the determining a porosity is performed after the rinsing.

14. The method of claim 13 wherein the rinsing includes rinsing with deionized water.

15. The method of claim 13 wherein the rinsing includes rinsing with a cleaning agent.

16. The method of claim 15 wherein the cleaning agent includes acetone.

17. The method of claim 10 further comprising:
after the exposing, drying the gold layer of the at least one contact structure with an inert gas, wherein the determining a porosity occurs after the drying.

18. The method of claim 10 wherein the exposing is performed for less than 30 minutes.

19. The method of claim 10 wherein the plurality of support structures are manufactured using the same processes.

20. The method of claim 10, wherein the solution includes glacial acetic acid and nitric acid in a 1:1 ratio.

21. A method of testing a contact structure, the method comprising:
exposing a gold layer of at least one contact structure of a package substrate to a solution including glacial acetic acid and nitric acid, wherein the solution includes glacial acetic acid and nitric acid in a 1:1 ratio;
rinsing the gold layer of the at least one contact structure with a cleaning agent after the exposing;
drying the gold layer of the at least one contact structure with an inert gas after the rinsing; and
determining a porosity of the gold layer of at least one contact structure after the drying.

22. The method of claim 21 wherein each of the at least one contact structure includes a layer including nickel underneath the gold layer of the contact structure.

* * * * *